Dec. 13, 1966 R. EMEIS ET AL 3,292,056

THERMALLY STABLE SEMICONDUCTOR DEVICE WITH AN INTERMEDIATE PLATE FOR PREVENTING FLASHOVER

Filed March 13, 1964

United States Patent Office 3,292,056
Patented Dec. 13, 1966

3,292,056

THERMALLY STABLE SEMICONDUCTOR DEVICE WITH AN INTERMEDIATE PLATE FOR PREVENTING FLASHOVER

Reimer Emeis, Ebermannstadt, and Horst Schreiner, Nurnberg, Germany, assignors to Siemens-Schuckertwerke Aktiengesellschaft, Berlin-Siemensstadt, Germany, a corporation of Germany Filed Mar. 13, 1964, Ser. No. 351,604
Claims priority, application Germany, Mar. 16, 1963, S 84,205
9 Claims. (Cl. 317—234)

Our invention relates to the electronically active component of p-n junction diodes, transistors, semiconductor controlled rectifiers and other semiconductor devices. More particularly, the invention concerns semiconductor components or elements in which an essentially monocrystalline semiconductor body is in broad-area connection with a carrier plate of good electrical and thermal conductance whose thermal coefficient of expansion does not appreciably differ from that of the semiconductor material so as to prevent mechanical damage to the crystalline body due to changes in operating temperature of the device. For semiconductors of silicon or germanium, the carrier plate may consist of molybdenum.

It has been proposed to additionally provide such a semiconductor element with a porous body of sintered metal, preferably also of molybdenum, on the opposite side of the semiconductor body to form a thermally stable transition between the electrode on the semiconductor body and a contact terminal proper.

In known semiconductor devices of this type, the insulation distance between the molybdenum plate on top of the silicon body and the location where the p-n junction emerges at the surface of the silicon body is rather small, amounting to only 1 mm. approximately. This poses the danger of flash-over under high voltages above 1000 volts. Filling the interspace with a hardening insulation material, such as casting resin, leaves much to be desired because of the difficulty in filling the narrow gap without leaving pores.

It is an object of the invention to obviate the above-mentioned difficulties.

To this end, and in accordance with a feature of our invention, we provide the sintered porous intermediate plate with an integral projection which faces the semiconductor body and has at the semiconductor body a cross-sectional area smaller than that of the body, and we further provide the intermediate plate with a laterally protruding portion at the side remote from the semiconductor body, the area of the latter portion being larger than the above-mentioned area of the projection.

According to another, more specific feature of our invention, the projection of the porous intermediate plate is given a frustoconical shape, whose base is located at the laterally protruding, wide portion of the plate.

As mentioned, a semiconductor element of this type, as a rule, is equipped with a carrier plate on the side remote from the above-mentioned intermediate plate. The carrier plate preferably consists at least partially of molybdenum, but may also consist of molybdenum and/or tungsten, and in each case contain an addition of nickel in an amount between 0.05 and 5% by weight. The above-mentioned relatively wide portion of the intermediate plate is preferably given an area whose size is fully or substantially identical with that of the just-mentioned carrier plate.

According to a further feature of our invention, the sintered intermediate plate is provided with a galvanically deposited metal coating, preferably a nickel coating of up to about 30-micron thickness.

It is further of advantage to coat the inner surfaces of the element with insulating varnish in the space between the intermediate plate and the housing or capsule in which the element is mounted. However, this interspace may also be filled with insulating material in the form of a hardening synthetic plastic which may contain filler substance if desired.

Further sintered plates may be added to also serve as intermediate plates; and the sintered plates used are preferably ground or lapped. As mentioned, the invention is applicable to rectifier elements and other p-n junction elements whose semiconductor body consists of silicon, germanium or other semiconductor materials.

The invention will be further described with reference to embodiments illustrated by way of example of the accompanying drawings in which.

Figures 1, 2:
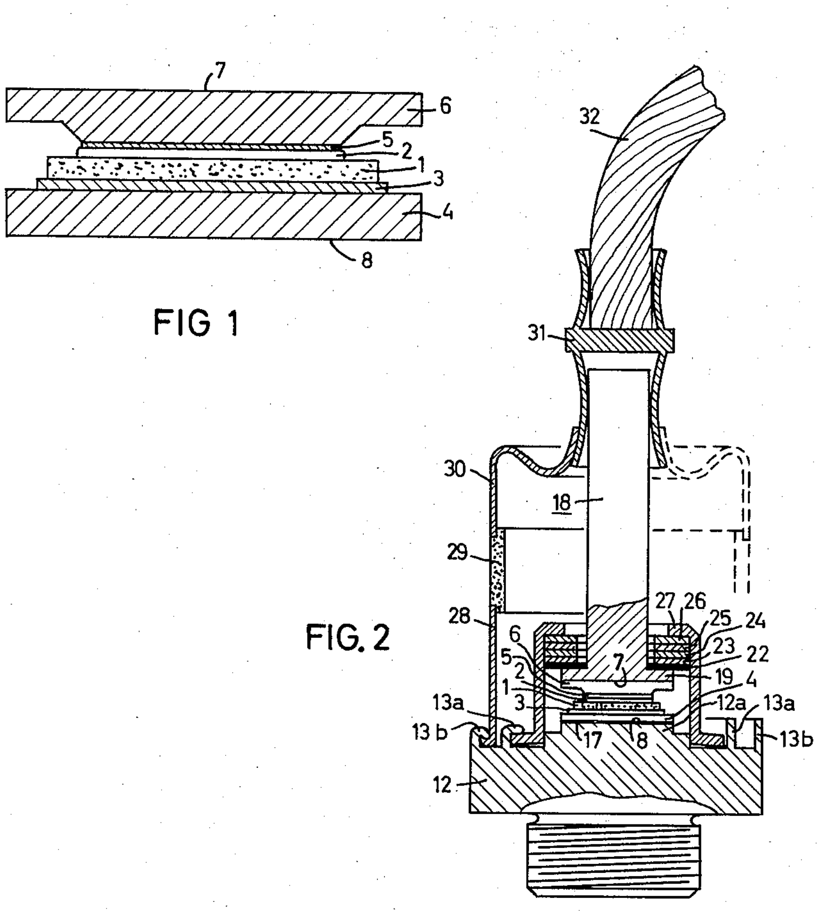
FIG. 1 is a sectional view of a silicon diode element for power rectifying purposes.
FIG. 2 shows in section, a rectifier element according to FIG. 1, together with an appertaining capsule.

Denoted by 1 in FIG. 1 is a circular disc of monocrystalline silicon which carries a gold electrode 2 and an aluminum electrode 3 on its respective planar faces. The silicon body rests with its aluminum electrode 3 in face-to-face relation upon a planar carrier plate 4 of molybdenum. The top electrode 2 is in face-to-face contact with a profiled intermediate plate 6 which carries a silver coating 5. The intermediate plate 6 consists predominantly of molybdenum or tungsten or a mixture of both metals, and contains an addition of nickel in an amount of 0.05 to 5% by weight.

If desired, the carrier plate 4, which is alloy bonded with the aluminum layer 3, may also be made of sintered metal. In this case, it is also preferable to add nickel in an amount of 0.05 to 5%, preferably about 1%. The surface of such a sintered carrier plate 4 may also be provided with an electroplated layer of nickel up to 30 microns thick. The nickel coating may also be deposited by any other known method, for example by vapor deposition. The surfaces 7 and 8 of the sinter plates are ground and thereafter lapped to accurate planar shapes.

The encapsulated rectifier illustrated in FIG. 2 comprises a massive copper block 12 of circular shape which has an integral threaded bolt and serves as a heat-sink structure. The copper block 12 has a central projection or pedestal 12a upon which the carrier plate 4 of the semiconductor element proper is fastended. An annular projection 13a concentrically surrounding the projection 12a serves for fastening a clamp or holder 27. An annular concentric edge portion 13b of the copper block, protruding upwardly in concentric relation to the projection 12a, serves for fastening a housing portion of the capsule to the copper block, as will be more fully described below. Mounted on the central projection 12a is the rectifier element proper, consisting of a sandwich of a carrier plate 4, a semi-conductor body 1 alloy-bonded with the carrier plate 4, and an electrode 2 area-bonded with the semiconductor plate and forming a p-n junction therewith. The rectifier sandwich element corresponds to the one shown in FIG. 1. It can be produced, for example, as follows.

Placed upon a circular molybdenum plate 4 of about 22 mm. diameter and 2 to 3 mm. thickness is a disc of aluminum foil about 19 mm. in diameter and about 0.05 mm. thick. Placed on top of the aluminum disc is a circular body 1 of monocrytalline p-type silicon of about 1000 ohm cm. specific resistance. The silicon body has a diameter of about 18 mm. and a thickness of 0.3 mm. Then follows a gold foil 2 of 0.1 mm. thickness, containing about 0.5% by weight of antimony, the diameter of the foil being smaller than that of the silicon body, for instance 14 mm.

This sandwich assembly is embedded in a powder that does not react with the just-mentioned materials and does not melt at the alloying temperature. Suitable as such powder in graphite. The embedded assembly is then heated within the embedding powder under pressure to a temperature of about 800° C. The heating can be effected in an alloying furnace evacuated or filled with protective gas. Thereafter the assembly is permitted to cool to room temperature. Then the two flat sides of the sandwich are lapped to planar shape with the aid of a grinding agent of suitable fine-granular constitution and are thereafter cleaned to remove the lapping residues.

During the alloying procedure just described, the gold foil becomes alloyed together with the adjacent region of the silicon, and the alloyed region becomes doped with antimony and assumes n-type conductance, thus forming a p-n junction in the silicon body 1. Upon completion of the lapping operation, the outer edge of the p-n junction emerges at the free semiconductor surface. This surface is then subjected to etching which can be carried out in known manner, for example as described in U.S. Patent No. 3,010,885 or U.S. Patent No. 3,041,225. Residues of the etching agent can be rinsed off with distilled water. It is preferable to follow the etching operation by an oxidation process, for example as described in U.S. Patent No. 3,010,885, or by rinsing with a ten times or more diluted solution of the chemical etching agent previously employed, or also by subjecting the assembly for a few minutes to an atmosphere to which vapor from this etching agent has been added.

According to FIG. 2, a relatively thick silver layer 17 is interposed between the molybdenum carrier plate 4 of the rectifier sandwich assembly described above and the central projection 12*a* of the cooling body 12. The silver layer 17 consists of a foil having 0.1 to 0.2 mm. thickness. The foil 7 is preferably provided on both sides with a raised pattern, for example a waffle pattern similar to the knurling of knurled knobs. According to a preferred embodiment, the silver foil is first degassed by annealing and subsequently etched, for example with the aid of nitric acid, whereby a fine etching pattern on the surface is produced.

Placed upon the top side of the semiconductor assembly, that is upon the electrode 2 consisting of gold-silver eutectic, is a plunger-shaped member 18, 19. Before being assembled with the rectifier sandwich, this member is preferably composed of its individual components, namely a copper pin 18, a washer 19 of copper and the above-described sintered and properly profiled intermediate plate 6 of molybdenum. The three parts are firmly joined with each other by hard soldering (brazing). The bottom side of the molybdenum plate 6 is preferably silver plated and thereafter lapped to planar shape. The operational heat causes a partial and mutually effective diffusion of silver and gold particles to occur at the contact resulting in a firm and rigid bond. If desired, the two parts can also be solidly bonded during manufacture of the device by moderately heating the parts, while being pressed together, for example to a temperature of 200 to 250° C. for a few hours.

Positioned on and around the plunger-shaped member 18, 19 are a mica washer or disc 22, a steel washer 23, and three ring-shaped or saucer springs 24, 25, 26. The springs have curved shape when not under pressure. After assembling these parts, a bell-shaped holder 27 is placed over the washer 19 end of the copper pin 18. The holder 27 has a bottom flange which is thereafter fastened to the copper body 12 by bending the projection 13*a* from the straight shape shown on the right-hand side of FIG. 2 to the deformed shape shown at the left-hand side. The upper part of the holder 27 constitutes an abutment for the saucer springs 24, 25, 26 which, in assembled condition of the semiconductor device, are compressed to planar shape and then exert the necessary contact pressure against the rectifier sandwich, thus forcing the sandwich with its molybdenum carrier plate 4 against the silver layer 17.

As apparent from FIG. 2, the device has an extremely compact design in which all component parts are accurately secured in proper position to one another and therefore cannot become displaced by mechanical jarring nor by thermal displacements. The outer edge of the mica disc 22 abuts against the cylindrical inner wall of the holder 27, and the inner edge of the mica disc 22 touches the copper pin 18. As a result, the mica disc 22 electrically insulates the holder 27 from the top side of the semiconductor element and also centers the pin 18.

The assembling work is completed by placing a bell-shaped housing portion, composed of individual parts 28, 29, 30 and 31, over the entire arrangement so far described. As its lower rim, the part 28 has an outwardly projecting flange which is fastened to the copper block 12 by deforming the marginal projection 13*b* of the block, shown in original shape at the right-hand side of FIG. 2 and in ultimate shape at the left-hand side. The copper pin 18 is joined with the housing by pressing the part 31 firmly against the top portion of pin 18. The part 31 preferably consists of copper, whereas the parts 28 and 30 consist of steel or an iron-nickel-cobalt alloy such as available in the trade under the trade names Kovar or Vacon. Parts 30 and 31 are soldered or welded to each other. Part 29 is insulation and preferably consists of ceramic material. It is metallized at those places where it is joined with parts 28 and 30 so that they can be joined with part 29 by soldering. A cable 32, inserted from the outside into part 31, is joined therewith by a pressed connection.

It will be understood that the rectifier assembly proper, comprising the semiconductor body with the alloyed electrodes and alloy-bonded carrier plate, may have a constitution and design other than illustrated and described. For example, the semiconductor body may consist of germanium with alloy-bonded electrodes of indium or lead-arsenic. The carrier plate may consist, for example, of certain highly alloyed types of steel, particularly those containing nickel and cobalt, which possess a similar coefficient of expansion as the semiconductor material, such as germanium or silicon. The semiconductor body may also consist of silicon carbide or of an intermetallic III–V compound of respective elements from the third and fifth groups respectively of the periodic system of elements, or the semiconductor body may consist of a II—VI compound of respective elements from the second and sixth groups of the periodic system, semiconductor compounds of these types, as well as electrode and carrier-plate metals suitable therefor, being known for such purposes (for example from the book "Semiconductors," edited by N. B. Hannay, published 1959, by Reinhold Publishing Corp., New York, chapter 9 and pertaining bibliography).

A rectifier element according to the invention, as described in the foregoing, comprising the semiconductor body 1 with its electrodes as well as the carrier and the intermediate plates, can also be inserted into the capsule in reversed electric orientation. This affords providing semiconductor diodes which have respectively different polarities but the same external design, the same electric characteristics, and also a similar internal design.

Figure 3:
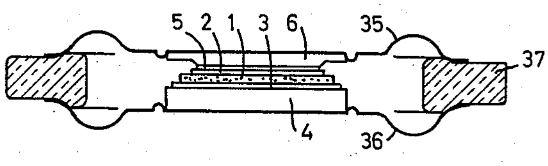
FIG. 3 shows in section another encapsulated semiconductor element.

In FIG. 3 the semiconductor body is denoted by 1 as in FIGS. 1 and 2 and parts 2 to 6 also correspond to those denoted by the same reference numerals 1 and described above. The semiconductor element is enclosed in a housing composed of two-disc-shaped parts 35 and 36 of metal and an outer ring-shaped part 37 of insulating material. The diaphragms 35 and 36 have relatively small thickness so as to act as flexible diaphragms between their marginal portion and those central area portions to which the carrier plate 4 and the intermediate plate 6 are attached. The marginal portion of each diaphragm 35, 36 is firmly joined with the insulating body 37, for example by hard soldering. Due to the particular shape of the profiled sintered intermediate plate 6, the air gap distance between the marginal semiconductor area on the top surface of the silicon body 1, on the one hand, and the closest contact metal on the other hand, is greatly increased. In this embodiment, the housing portions enveloping the semiconductor element proper, as well as the parts enclosed in the housing consist of materials having approximately the same thermal coefficient of expansion.

The production of insert elements for rectifying purposes as shown in FIGS. 1 and 3, will be described presently more in detail with reference to two examples.

*Example I*

Used is a carrier plate 4 of molybdenum according to FIG. 1, having a diameter of 20 mm. An electrode foil 3 of aluminum 19 mm. in diameter is placed on top of plate 4, and thereupon a silicon disc of 18 mm. diameter. Placed on top is an Au-Sb-foil 2 of 14 mm. diameter, to serve as an electrode. The assembly is alloyed under slight pressure at about 800° C. by the known alloying process mentioned above. Thereafter, the top and bottom surfaces are lapped and etched. Then the semiconductor member is placed with the Au electrode upon the lapped silver surface 5 of the sintered intermediate plate 6 according to the invention and held under slight pressure. The Ag-layer is located on the preferably frustoconical projection of the sintered intermediate plate. This shape of the plate secures optimal dissipation of heat. After the rectifying element is inserted into a housing or capsule, the space remaining between the two plates 4 and 6 need not be filled when such a frustoconical shape is used. However, it is preferable to coat the interspace with insulating varnish or to completely fill the interspace with casting resin. The Ag-layer 5 on the intermediate plate may also be substituted by a layer of gold or copper, nickel or a metal alloyable with gold. The two contact faces 7 and 8 are lapped. The plates 4 and 6 consist of molybdenum and/or tungsten with a nickel addition between 0.2 and 3%. For increasing the heat conductance, the intermediate plate 6 or the carrier plate may also be given an addition of up to 50% by weight of silver.

*Example II*

Used is a sintered intermediate plate 4 according to FIG. 1 consisting of 99% molybdenum and 1% nickel and having a diameter of 20 mm. and a thickness of about 2 mm. Placed on top of the plate 4 is an Al-electrode foil of 19 mm. diameter, thereupon a silicon disc 1 of 18 mm. diameter, and on top an Au-Sb-electrode foil of 14 mm. diameter. This sandwich assembly is alloyed under slight pressure at 800° C. The further fabrication is as in Example I.

To those skilled in the art, it will be obvious upon a study of this disclosure that with respect to design, details and materials, our invention permits of various modifications and hence can be given embodiments other than particularly stated and described herein, without departing from the essential features of our invention and within the scope of the claims annexed.

We claim:

1. A semiconductor element comprising a carrier plate, a flat semiconductor body having electrodes on opposite sides thereof and being located on top of said carrier plate, the opposite sides of said semiconductor body having determined transverse surface areas, a contact member above said semiconductor body, a porous intermediate plate of sintered conductive material conductively attached between said contact member and said semiconductor body and having an integral projection facing said semiconductor body, said projection having a smaller transverse surface area than said semiconductor body, said intermediate plate having upwardly adjacent to said projection a laterally protruding portion of larger transverse area than said projection, and a nickel coating on the transverse surface of said intermediate plate adjacent said semiconductor body.

2. In a semiconductor element according to claim 1, said projection of said intermediate plate having a substantially frustoconical shape whose base is located at said laterally protruding portion.

3. In a semiconductor element according to claim 1, said nickel coating having a thickness of less than 30 microns.

4. In a semiconductor element according to claim 1, said intermediate plate being formed of at least one metal selected from the group consisting of molybdenum and tungsten, and an addition of .05 to 5% nickel.

5. In a semiconductor element according to claim 1, said intermediate plate being formed of at least one metal selected from the group consisting of molybdenum and tungsten and having a nickel coating of up to 30-micron thickness.

6. In a semiconductor device according to claim 1, the surfaces bordering the space between said intermediate plate and said semiconductor body having an insulating varnish coating.

7. A semiconductor device according to claim 1, comprising a hardened synthetic resin which fills the space between said intermediate plate and said semiconductor body.

8. In a semiconductor element according to claim 1, said intermediate plate having lapped surfaces.

9. A rectifier element comprising a molybdenum-containing carrier plate having a planar top surface, a flat silicon body with electrodes on opposite faces thereof, the opposite faces of said silicon body having determined transverse areas, said body being placed face-to-face on top of said carrier plate, a contact member above said silicon body, a sintered porous intermediate plate positioned between and conductively connecting said contact member with said silicon body and formed of at least one metal selected from the group consisting of molybdenum and tungsten, said intermediate plate having an integral downwardly tapering frusto-conical projection facing said silicon body, said projection having a smaller transverse surface area than the face of said silicon body, said intermediate plate having upwardly adjacent to said projection a laterally protruding portion of larger transverse area than said projection, and a nickel coating on the transverse surface of said intermediate plate adjacent said silicon body.

References Cited by the Examiner

UNITED STATES PATENTS

| | | | |
|---|---|---|---|
| 2,801,375 | 7/1957 | Losco | 317—234 |
| 2,990,502 | 6/1961 | Willemse | 317—240 |
| 3,013,192 | 12/1961 | Starr | 317—235 |
| 3,097,329 | 7/1963 | Siemens | 317—234 |
| 3,192,454 | 6/1965 | Rosenheinrich et al. | 317—234 |
| 3,222,579 | 12/1965 | Fitzgibbon et al. | 317—234 |

FOREIGN PATENTS

| | | |
|---|---|---|
| 895,326 | 5/1962 | Great Britain. |

JOHN W. HUCKERT, *Primary Examiner.*

A. M. LESNIAK, *Assistant Examiner.*